US007802215B2

United States Patent
Reddy et al.

(10) Patent No.: US 7,802,215 B2
(45) Date of Patent: *Sep. 21, 2010

(54) SYSTEM AND METHOD FOR PROVIDING AN IMPROVED SLIDING WINDOW SCHEME FOR CLOCK MESH ANALYSIS

(75) Inventors: Subodh M. Reddy, Sunnyvale, CA (US); Rajeev Murgai, Santa Clara, CA (US)

(73) Assignee: Fujitsu Limited, Kawasaki (JP)

( * ) Notice: Subject to any disclaimer, the term of this patent is extended or adjusted under 35 U.S.C. 154(b) by 108 days.

This patent is subject to a terminal disclaimer.

(21) Appl. No.: 11/754,586

(22) Filed: May 29, 2007

(65) Prior Publication Data
US 2007/0283305 A1 Dec. 6, 2007

Related U.S. Application Data

(60) Provisional application No. 60/804,041, filed on Jun. 6, 2006.

(51) Int. Cl.
*G06F 17/50* (2006.01)
(52) U.S. Cl. ............................................. 716/6; 716/5
(58) Field of Classification Search .................. 716/4–6
See application file for complete search history.

(56) References Cited

U.S. PATENT DOCUMENTS

| 5,917,729 | A * | 6/1999 | Naganuma et al. ............ 716/10 |
| 6,389,582 | B1 * | 5/2002 | Valainis et al. ................. 716/9 |
| 6,421,814 | B1 * | 7/2002 | Ho ................................. 716/5 |
| 7,392,495 | B1 * | 6/2008 | Cherukupalli et al. ......... 716/10 |

* cited by examiner

*Primary Examiner*—Jack Chiang
*Assistant Examiner*—Binh C Tat
(74) *Attorney, Agent, or Firm*—Baker Botts L.L.P.

(57) ABSTRACT

A method is provided and includes accessing a description of a chip, which includes sequential elements and a clock mesh. Items used include: the description of the chip, the information for modeling the sequential elements and interconnections, and the set of parameters of the clock mesh. Additionally, the method includes determining a plurality of original window locations covering the clock mesh. Further, for each original window location, the method includes expanding the original window location in one or more directions to generate a larger window location; generating a mesh simulation model inside the larger window location; simulating the mesh simulation model; measuring clock timing for the sequential elements in the original window location based on the simulation of the mesh simulation model; and collecting timing information on all the sequential elements on the chip based on the measured clock timing for the sequential elements in the original window locations.

20 Claims, 5 Drawing Sheets

CLOCK MESH ARCHITECTURE

SINGLE-π MODEL FOR INTERCONNECT

3-π MODEL FOR INTERCONNECT

FLOWCHART FOR MPS-BASED
CLOCK MESH ANALYSIS

MAXIMUM ERROR IN
MPS AS A FUNCTION
OF BORDER SIZE

CPU TIME FOR MPS ON
c5/f1K/m16 AS A FUNCTION
OF WINDOW SIZE

CPU TIME FOR MPS ON
c5/f10K/m16 AS A FUNCTION
OF WINDOW SIZE

CPU TIME FOR MPS ON
c5/f10K/m64 AS A FUNCTION
OF WINDOW SIZE

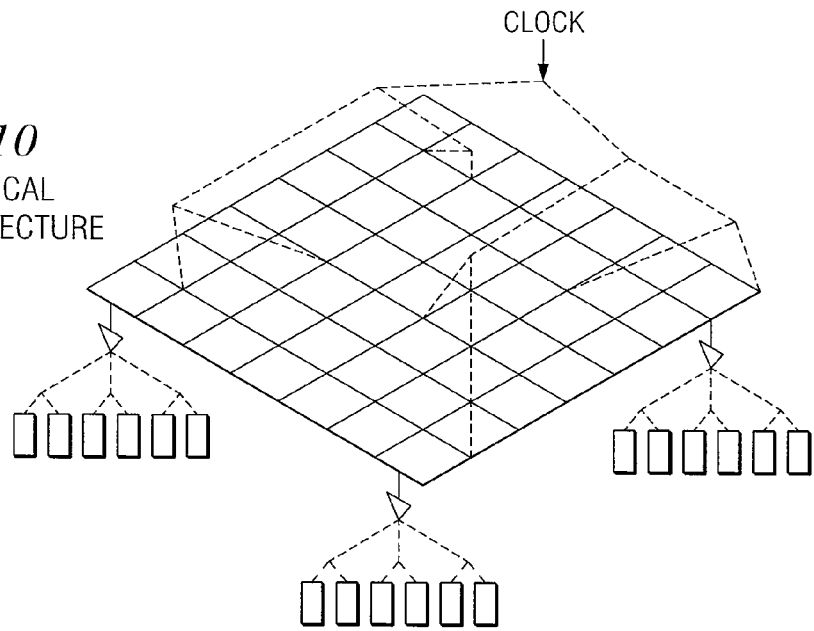
FIG. 10
MESH+LOCAL
TREES ARCHITECTURE
FIG. 11
CLOCK ARCHITECTURE
WITH MULTIPLE MESHES
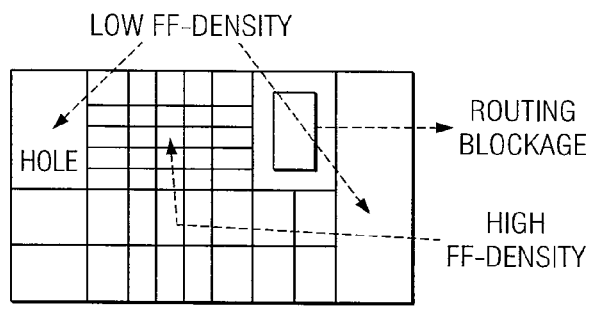
FIG. 12
NON-UNIFORM
MESH

SYSTEM AND METHOD FOR PROVIDING AN IMPROVED SLIDING WINDOW SCHEME FOR CLOCK MESH ANALYSIS

RELATED APPLICATIONS

This application claims the priority under 35 U.S.C. §119 of provisional application Ser. No. 60/804,041 filed Jun. 6, 2006.

TECHNICAL FIELD OF THE INVENTION

This invention relates in general to the field of clock meshes and, more particularly, to a system and a method for providing an improved sliding window scheme for clock mesh analysis.

BACKGROUND OF THE INVENTION

The proliferation of integrated circuits has placed increasing demands on the design of digital systems and microprocessors included in many devices, components, and architectures. The number of digital systems that include microprocessors continues to steadily increase and is driven by a wide array of products and systems. Added functionalities may be implemented in integrated circuits in order to execute additional tasks or to effectuate more sophisticated operations in their respective applications or environments.

In the context of microprocessors, present generation embedded systems have stringent requirements on accuracy, performance, and power consumption. Many embedded systems employ sophisticated algorithms for communications, image processing, video processing etc, which can be computationally intensive. Mesh or grid architectures are popular for distributing critical global signals on a chip such as clock and power/ground. The mesh architecture uses inherent redundancy created by loops to smooth out undesirable variations between signal nodes spatially distributed over the chip. These variations can be due to non-uniform switching activity in the design, within-die process variations and asymmetric distribution of circuit elements (such as flip-flops). For power/ground, mesh can help reduce voltage variations at different nodes in the network due to non-uniform switching activities.

However, one imposing problem that has limited the applicability of mesh architectures is the difficulty in analyzing them with sufficient accuracy. The main reasons are the huge number of circuit nodes needed to accurately model a fine mesh in a large design and large number of metal loops (cycles) present in the mesh structure. Accordingly, the ability to address these issues/complex operations to achieve optimal processing provides a significant challenge to system designers and component manufacturers alike.

SUMMARY OF THE INVENTION

Particular embodiments of the present invention may reduce or eliminate problems and disadvantages associated with previous clock mesh systems.

In one embodiment, a method for clock mesh analysis is provided and includes accessing a description of a chip comprising a plurality of sequential elements and a clock mesh, the description identifying the sequential elements, indicating locations of the sequential elements on the chip, specifying interconnections among the sequential elements on the chip, and specifying a layout of the chip. The method also includes accessing information for modeling the sequential elements and interconnections and a set of parameters of the clock mesh. The method further includes using the description of the chip, the information for modeling the sequential elements and interconnections, and the set of parameters of the clock mesh. Additionally, the method includes determining a plurality of original window locations covering the clock mesh, each original window location comprising one or more of the sequential elements on the chip. Further, for each original window location, the method includes expanding the original window location in one or more directions to generate a larger window location; generating a mesh simulation model inside the larger window location; simulating the mesh simulation model; measuring clock timing for the sequential elements in the original window location based on the simulation of the mesh simulation model; and collecting timing information on all the sequential elements on the chip based on the measured clock timing for the sequential elements in the original window locations.

Particular embodiments may provide one or more other technical advantages, one or more of which may be readily apparent to those skilled in the art from the figures, descriptions, and claims herein.

BRIEF DESCRIPTION OF THE DRAWINGS

For a more complete understanding of the present invention and its advantages, reference is now made to the following descriptions, taken in conjunction with the accompanying drawings, in which:

FIG. 10 is a simplified diagram illustrating a mesh along with local trees in accordance with an embodiment of the present invention;

FIG. 11 is a simplified diagram of a clock architecture with multiple meshes in accordance with an embodiment of the present invention; and FIG. 12 is a simplified diagram of an example non-uniform mesh in accordance with an embodiment of the present invention.

DETAILED DESCRIPTION OF EXAMPLE EMBODIMENTS OF THE INVENTION

Figure 1:
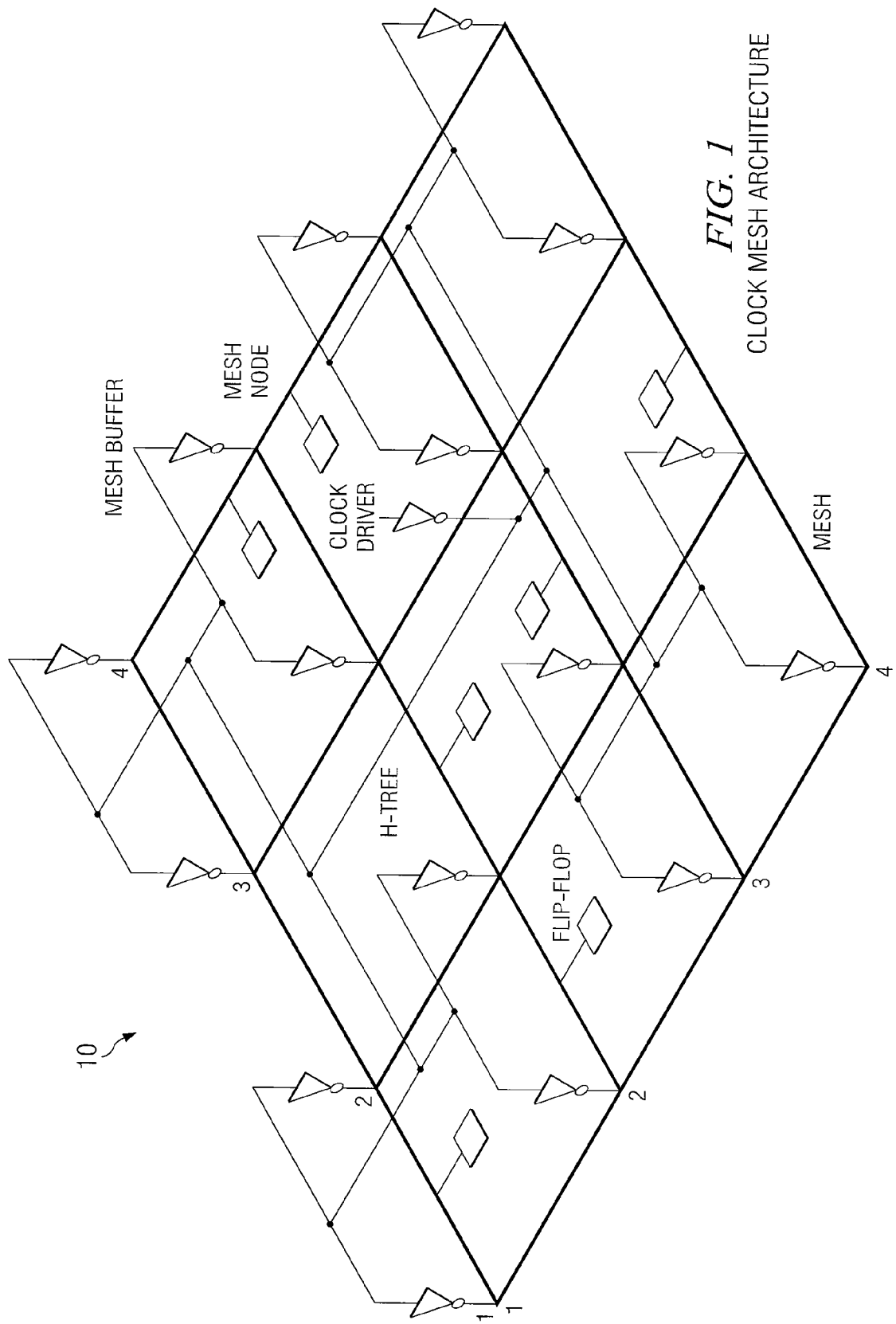
FIG. 1 is a simplified diagram of an example mesh architecture system used for distributing a clock signal from a phase lock loop (PLL) or a root buffer to sequential elements according to various embodiments of the present invention.

FIG. 1 is a simplified diagram of a typical or example mesh architecture system 10 used for distributing a clock signal from a phase lock loop (PLL) or root buffer to sequential elements such as flip-flops (FFs) and latches on the chip. It has three main components: 1) a (uniform) mesh, 2) a global buffered tree that drives the mesh, and 3) local interconnect, which connects the clock inputs of FFs directly to the nearest point on the mesh. The mesh is a uniform rectangular grid of wires spanning the entire chip area, driven by the mesh buffers and propagating the clock to the FFs. An m×n mesh or grid has m rows (horizontal wires) and n columns (vertical wires). The size of the mesh is m×n. For a given chip size, the greater the mesh size, the more fine-grain the mesh is. A mesh node (or grid node) is the point where each row is connected to each column. As shown in FIG. 1, the global (H−) tree delivers the clock signal to the mesh nodes via buffers called mesh buffers. We assume a uniform array of k×l mesh buffers. In FIG. 1, k=m=4 and l=n=4. The mesh wire between two adjacent mesh nodes is called a mesh segment, and represents one grid unit.

For purposes of teaching and discussion, it is useful to provide some overview as to the way in which the following invention operates. The following foundational information may be viewed as a basis from which the present invention may be properly explained. Such information is offered earnestly for purposes of explanation only and, accordingly, should not be construed in any way to limit the broad scope of the present invention and its potential applications.

Mesh or grid architectures are popular for distributing critical global signals on a chip such as clock and power/ground. The mesh architecture uses inherent redundancy created by loops to smooth out undesirable variations between signal nodes spatially distributed over the chip. These variations can be due to non-uniform switching activity in the design, within-die process variations and asymmetric distribution of circuit elements (such as flip-flops). For power/ground, mesh can help reduce voltage variations at different nodes in the network due to non-uniform switching activities.

One significant problem that has limited the applicability of mesh architectures is the difficulty in analyzing them with sufficient accuracy. The main reasons are the huge number of circuit nodes needed to accurately model a fine mesh in a large design and large number of metal loops (cycles) present in the mesh structure. Accordingly, the ability to address these issues/complex operations to achieve optimal processing provides a significant challenge to system designers and component manufacturers alike.

For the clock signal, a mesh (FIG. 1) has been shown to achieve very low skew in microprocessor designs, e.g., Digital 200-MHz Alpha and 600-MHz Alpha; IBM G5 S/390, Power4 and PowerPC; SUN Sparc V9. Mesh also has excellent jitter mitigation properties.

Traditional static timing analysis (STA) techniques propagate timing information from inputs to outputs (or vice versa) and require that the underlying graph structure be a directed acyclic graph (DAG). They cannot handle directed loops (or cycles). As a result, circuit simulators such as SPICE are the only solution methodology available for mesh analysis. Circuit simulators can handle cycles in the circuit structure. However, they either require inordinate amount of memory or run-time. In fact, both HSPICE and HSIM (from Synopsys) fail to analyze even coarse clock meshes for an industrial design.

A sliding window scheme (SWS) for analyzing latency of clock meshes is possible. SWS uses different resolutions for modeling nodes closer to and far from nodes of interest. It was shown to solve mesh and design instances, which exceeded memory capacity in HSPICE. An enhancement of SWS is desired and can be labeled as mesh partitioning scheme (MPS). MPS consumes much less memory than SWS, and is up to 300 times faster than the original sliding window scheme, without incurring any loss in accuracy. In addition, MPS can complete on real design and mesh instances, where SWS could not. Results on a related application, that of mesh timing uncertainty analysis, are discussed herein, where the MPS scheme could cut down the Monte Carlo-based simulation time from 300 hours (by SWS) to 118 hours. MPS can be applied to a pure mesh architecture (FIG. 1), with uniform or non-uniform mesh, and mesh-based hybrid architectures (discussed below). It can also be used for optimum clock mesh design and post-route mesh analysis. Finally, it works with any circuit simulator.

The Specification is organized as follows: previous and related work is described, followed by proposed enhancements [MPS]. MPS, the original SWS and golden SPICE simulations are then compared. Several design and analysis scenarios, where MPS can be used, are also discussed.

Figure 2:
FIG. 2 is a simplified diagram of a single-$\pi$ model for interconnect operations in accordance with embodiment of the present invention.

Beginning initially with the clock network model, FIG. 2 is a simplified diagram of a single-$\pi$ model for interconnect operations in accordance with embodiment of the present invention. Each buffer (mesh buffer and tree buffer) is modeled using the BSIM3 transistor models for NMOS and PMOS. Since the mesh is largely composed of wires, it is important to have an accurate wire model. To model wires smaller than 100μ, a single-$\pi$ model, which has two capacitors, a resistor and an inductor, is used (FIG. 2).

Figure 3:
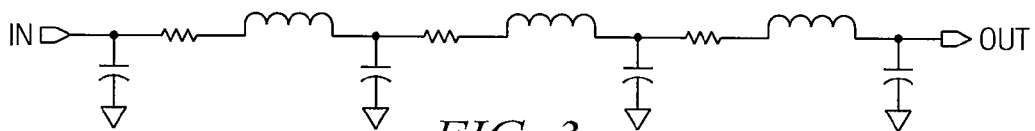
FIG. 3 is a simplified diagram of a 3-$\pi$ model for interconnect operations in accordance with an embodiment of the present invention.

FIG. 3 is a simplified diagram of a 3-$\pi$ model for interconnect operations in accordance with an embodiment of the present invention. For longer wires, a 3-$\pi$ model is used, as shown in FIG. 3. Studies on Fujitsu's 0.11μ technology showed that this scheme is delay-accurate within 0.5% of 4-$\pi$ and 5-$\pi$ models. It helps reduce the number of nodes in the SPICE model. The same rule is used to model wires that connect FFs to the mesh and wires on the global tree. The clock pin of a FF is modeled as an equivalent capacitance.

In any clock distribution scheme, one of the most important concerns is to accurately compute the clock arrival time a (also called clock delay or latency) at the clock input pin of each FF. Assume a path P in a design whose start and end gates are FFs $F_s$ and $F_e$. Let clock arrival times at these FFs be $a_s$ and $a_e$ respectively. The maximum delay $d_{max}$ allowed on P is a function of $(a_e - a_s)$, the difference in clock arrival times at the two FFs.

$$d_{max} \leq a_e - a_s + \tau - t_{set\_up}, \qquad (1)$$

where $\tau$ is the clock cycle and $t_{set\_up}$ is the set-up time for $F_e$. $a_e - a_s$ is known as the skew between $F_s$ and $F_e$. By comparing the arrival times among all FFs, we can compute the worst relevant clock skew in the design. This is the maximum negative difference in arrival times at two FFs that are connected by a data path. For a fixed clock cycle, the worst skew limits the maximum delay in the data path. Thus, it has a direct impact on the design turnaround time. Alternatively, for a given design, the skew impacts the maximum clock frequency for which the design will function correctly.

Since it is relatively straightforward and fast to compute the latency on the global tree, only the mesh timing analysis problem is addressed. Assume that the design is already placed and FF locations are known. The same clock signal source is assumed to drive all mesh buffers. The primary interest is in accurately computing the arrival time of the rising edge of the clock at each FF with respect to the clock source.

Not much has been published on the problem of clock mesh latency analysis. One solution presents a scheme to break the clock mesh into a tree and apply a smoothing algorithm to redistribute the mesh loads. The tree is analyzed for latency. However, no accuracy results are shown. In another work, the clock mesh is verified in two steps. First, AWE-based model-order reduction is performed on the mesh to simplify the mesh elements. Then, the simplified circuits are simulated using SPICE. The accuracy and efficiency of this method depend on the accuracy and stability of the moment matching technique. This scheme is orthogonal to the basic idea of MPS, and can be integrated with MPS. In fact, MPS already uses a form of model-order reduction, wherein a simpler π model is used for shorter wires.

Other solutions address a different mesh problem: that of sizing a clock mesh given constraints on clock latency. Another proposal breaks all the loops and converts the underlying mesh to a tree structure, since algorithmically it is easier to handle a tree. The RC delay at a grid node is approximated by the first order pole. Results on clock networks of two actual microprocessor designs are discussed. Another proposal uses dominant time constant as a measure of the signal delay (instead of Elmore delay) and formulates the sizing problem as a semi-definite programming problem. The results shown are for smaller mesh sizes. Both these methods use an approximate model of delays.

Figure 4:
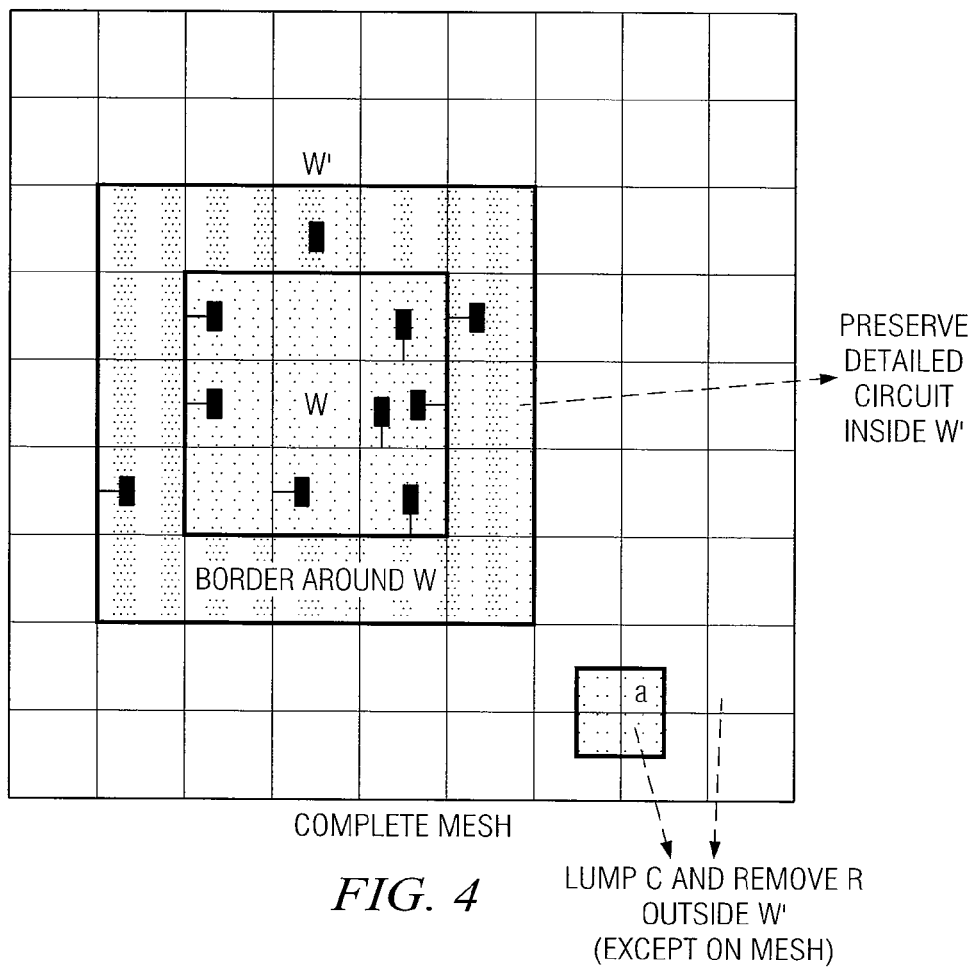
FIG. 4 is a simplified diagram of an example sliding window scheme in accordance with an embodiment of the present invention; stop

Recently, a sliding window scheme (SWS) was proposed for latency analysis of clock meshes. Turning to the SWS, FIG. 4 is a simplified diagram of an example sliding window scheme in accordance with an embodiment of the present invention. In SWS, the mesh is modeled with two different resolutions: a detailed circuit model is used for the mesh elements geometrically close to the nodes whose latency we are measuring and a simplified model is used for the mesh elements far from the nodes being measured. The simplification is with respect to the local FF connections. Given a mesh of size m×n, define a rectangular window W of size r×s, where r<m and s<n. Expand W by some border to obtain W' (FIG. 4, in which the border is 1 grid unit).

If the lower left corner of W' is fixed to a point on the mesh, W' covers some fixed region of the mesh (FIG. 4). The connection of a FF within W' to the nearest mesh segment is modeled accurately by an appropriate π model, as described herein (single π or 3-π, depending on the length of the connection). The clock input pin of the FF is modeled as a capacitance. FFs that lie outside W' and their connections to the mesh are modeled approximately. The wire connecting such a FF to the mesh is replaced by an equivalent single capacitance; the wire resistance is ignored. Given a mesh node a outside W', the region covered by a is the unit rectangle shown in FIG. 4.

Let $C_a$ be the sum of the clock input pin capacitances of all the FFs in this region along with the capacitances of the wires connecting them to the mesh. Then, $C_a$ is lumped as a single capacitance at a. The mesh segments outside W' are still modeled with appropriate π models. The SPICE file corresponding to this model for the window location is generated and simulated. The clock latencies at all FFs in the inner window W are measured. Next, the window W is slid horizontally or vertically so as not to overlap with the previous locations. Once again, a SPICE model is created and run. The entire mesh simulation is broken down into multiple independent window-based simulations. In fact, $$\lceil \frac{m-1}{r-1} \rceil * \lceil \frac{n-1}{s-1} \rceil$$

SPICE simulations are needed to cover the entire mesh and all the FFs in the design.

SWS is a divide-and-conquer partitioning technique. Approximating the region outside the window reduces the number of nodes in the circuit model. Approximating each FF saves either 7 nodes (if the wire is longer than 100μ) or 3 nodes (otherwise). In a typical design, where there are hundreds of thousands of FFs, reduction in the SPICE model size can be huge. It was shown earlier that HSPICE could not finish on a 65×65 mesh with 100K FFs. It needed more than 2 GB of memory, whereas SWS could complete in less than 1.5 hours within 1 GB memory using four machines. The latencies computed by SWS, using a border of 1 grid unit, are usually within 1% of the latencies computed from SPICE simulation of the complete mesh. It was also shown that using no border (i.e., a border of 0 grid units) does not always yield accurate results; errors of up to 30% were seen. By increasing the border beyond 1 grid, the accuracy does not improve much. However, the runtime increases significantly. In short, empirically a border of 1 grid unit was found to be optimum. In addition, window size was shown to have very little impact on accuracy. However, smaller window size means smaller model and hence better chances for large designs to fit in the memory. However, smaller window also implies more simulations.

Figure 5:
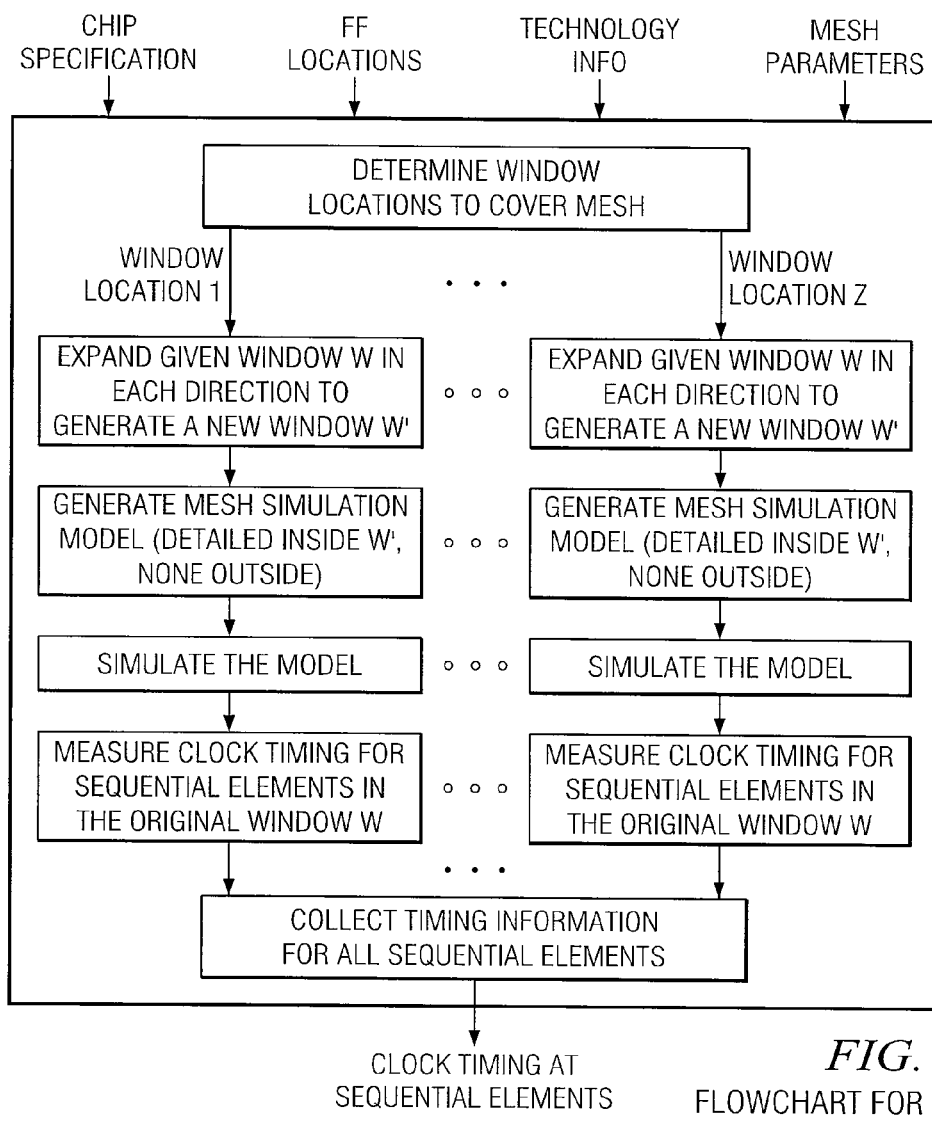
FIG. 5 is a simplified flowchart illustrating MPS-based clock mesh analysis in accordance with an embodiment of the present invention.

FIG. 5 is a simplified flowchart illustrating MPS-based clock mesh analysis in accordance with an embodiment of the present invention. The MPS-based clock mesh analysis may be performed by an apparatus that includes one or more processors and a memory that is coupled to the processors. The memory includes instructions that the one more processors are operable to execute to perform the analysis. The analysis may also be performed by executing logic that is encoded in one or more tangible media for execution. The basic idea behind SWS is that for each signal source, i.e., the mesh buffer, the clock mesh can be deemed as a cascaded low-pass RC filter. For this RC filter, the attenuation of a ramp input signal is proportional to the exponential of the distance. Because of this exponential attenuation, if two nodes are geometrically far, they have very small electrical impact on each other. This observation is made use of in SWS. For measuring the latency of flip-flops in a window W, the circuit nodes far from the window are modeled approximately, since they do not have much electrical impact on nodes in W. The nodes in W are modeled accurately. This scheme yields very accurate latency values most of the time. However, sometimes the error can be as high as 30%. To further reduce the error, a small region outside W, called the border of W, also had to be modeled accurately. Let W along with its border be called W'.

One possibility SWS did not explore was to use the border but ignore the circuit completely outside W'. The proposed new scheme is called mesh partitioning scheme (MPS). In MPS, windows and their borders are generated just as in SWS. Given a window W', the MPS circuit model for the region inside W' is identical to that in SWS. However, in MPS, the region outside W' is completely abstracted out. In other words, the MPS simulation model does not include any of the following:

1. mesh segments outside W'
2. FFs outside W' and
3. connections of the outside FFs with the mesh.

Recall from above that in SWS, the mesh segments outside W' are modeled with R, L and C (i.e., detailed modeling), and the FFs outside W' and their connections are approximated by a capacitance at the nearest mesh node.

The complete flow of MPS is shown in FIG. 5. It reads in a chip specification (e.g., chip dimensions), FF locations, technology information, mesh buffer sizes & locations, and mesh parameters (such as mesh size, wire widths), and computes clock arrival time at each FF. Given a window size, all window locations are determined to cover the entire clock mesh. For each window location, the window is expanded by a border, mesh simulation model is generated, and SPICE is run on the model to measure latencies of FFs in the core of the window. After all simulations are completed, latencies of FFs from all the simulations are collected. The only difference between MPS and SWS is in the box where mesh simulation model is generated. In SWS, approximate model is generated for the region outside the window.

Due to the smaller model size, MPS has the following two benefits over SWS.

1. MPS is faster than SWS, since its simulation model is strictly smaller than SWS. The SPICE simulation time is a monotone function of the model size.

2. The memory requirement in MPS is smaller. Hence, it has better chances at completion on a large design and mesh instance.

The superiority of MPS over SWS and the golden simulation is illustrated with an example. Assume a 65×65 mesh, and a design with 100KFFs, where these FFs are uniformly distributed over the chip. Further, assume that all the wire segments and mesh segments are modeled with a 3-π model. Let $N_g$ be the number of nodes in the golden model, which is obtained when all FFs and their clock pin wires are modeled accurately. Each mesh segment is modeled with the 3-π model and has 6 nodes (FIG. 3). The number of mesh segments is 64×65×2=8320. Hence, number of nodes on the mesh is about 50K. Each FF contributes seven nodes: one for the FF, one for the point where it is hooked to the mesh, and five internal nodes in the π model. Thus, FFs contribute about 700K nodes. Then, $N_g$ is about 750K.

In SWS, by using a window W' of size 17×17, for a given location of W', let the number of nodes in the SPICE model be $N_{W'}$. As before, the mesh segments will contribute 50K nodes to the model. However, only about 1/16 of the total FFs lie within W'. Then, only 7K FFs are modeled accurately. They contribute 49K nodes. The FFs outside W' do not contribute any additional nodes, since they are lumped at the nearest mesh node. Then, $N_{W'}$ is about 99K. Thus, we see a 7.5× reduction in the model size using SWS.

In MPS, only 17×16×2=544 mesh segments corresponding to W' are modeled, which result in about 3K nodes. The 7K FFs within the window are modeled as in SWS, with a total of 49K nodes. This results in a total of 52K nodes in MPS, a 1.9× reduction in node count over SWS and 14.4× reduction over the golden model.

Let us estimate the run-times of SWS and MPS vis-à-vis the golden SPICE run. Let us assume that the SPICE run-time is $O(N^{1.5})$. Since the number of nodes reduces by a factor of 7.5, each window simulation is about $7.5^{1.5}$=20.5 times faster than the golden model simulation. A total of 16 simulations are required to cover the entire mesh. Thus, we can expect an overall speed-up of 1.3 for sequential execution on a single machine and a speed-up of 20.5 for parallel execution (assuming that 16 machines are available). As for MPS, it will be about $1.9^{1.5}$=2.6 times faster than SWS.

In the following segment, results on the accuracy of MPS and the run-time comparison with SWS are presented. The proposed clock mesh analysis tool offers an architecture that reads in a chip specification (e.g., chip dimensions, FF locations), technology information, mesh buffer sizes & locations, and mesh parameters (such as mesh size, wire widths). It then uses SPICE transient simulation to compute clock latencies for the FFs with respect to the clock source (which is connected to the inputs of all the mesh buffers). The computation is based on the proposed sliding window scheme. Currently, it requires window size as input. For each window location, the tool generates the SPICE model for the mesh, local wires, and flip-flops within and outside the window. Unix shell scripts were written to manage the sliding windows' generation, simulation, and extraction of clock latencies from the simulation output.

In the following experiments, we perform accuracy and run-time comparisons between SWS and MPS. All the experiments were conducted in an industrial 0.11µ technology. Numerous experiments with different values of chip size, FF count, mesh size, and window size were conducted. FFs were placed randomly on the chip with a uniform distribution. A mesh buffer was used at every grid point. The following labeling scheme is used for an experiment. For instance, the experiment with a chip size of 5 mm×5 mm, FF count of 10K, and mesh size of 16×16, is labeled c5/f10K/m16.

In terms of accuracy, circuits with different FF count and mesh sizes were used. The circuit c5×10/f16.7K/m64 is an actual chip. For each mesh size, different window sizes were used in SWS and MPS. The latency from golden (flat) simulation is taken as the reference latency for each FF. Latencies yielded by SWS and MPS (both using a border of 1 grid unit) at a FF are then compared with the corresponding reference latency and percentage error is computed. Maximum over and average of errors of all FFs are computed and reported in Table 1. It can be seen that MPS is very accurate: the maximum error is always less than 1.4% and average error is at most 0.3%. The error numbers are similar to those with SWS.

TABLE 1

Accuracy of MPS & SWS vis-a-vis golden simulation.

|  | max. golden |  | % error | | | |
|---|---|---|---|---|---|---|
|  |  |  | max | | avg | |
| exp | lat. (ps) | \|W\| | SWS | MPS | SWS | MPS |
| c5/f1K/m16 | 648.02 | 2 | 0.32 | 0.76 | 0.13 | 0.30 |
|  |  | 4 | 0.30 | 0.70 | 0.13 | 0.26 |
|  |  | 8 | 0.24 | 0.51 | 0.10 | 0.12 |
|  |  | 12 | 0.30 | 0.54 | 0.09 | 0.13 |
| c5/f10K/m16 | 652.44 | 2 | 1.52 | 1.36 | 1.03 | 0.21 |
|  |  | 4 | 1.49 | 1.19 | 0.93 | 0.18 |
|  |  | 8 | 1.03 | 0.54 | 0.88 | 0.08 |
|  |  | 12 | 1.17 | 0.92 | 0.91 | 0.13 |
| c5/f10K/m64 | 808.04 | 4 | 0.50 | 0.49 | 0.42 | 0.12 |
|  |  | 8 | 0.43 | 0.31 | 0.37 | 0.12 |
|  |  | 16 | 0.39 | 0.23 | 0.29 | 0.08 |
|  |  | 32 | 0.37 | 0.15 | 0.21 | 0.03 |
|  |  | 48 | 0.38 | 0.21 | 0.24 | 0.05 |
| c5×10/f16.7K/m64 | 1032.12 | 4 | 0.28 | 0.63 | 0.01 | 0.11 |

\|W\| denotes the window size. \|W\| = 2 means 2 × 2 window

Figure 6:
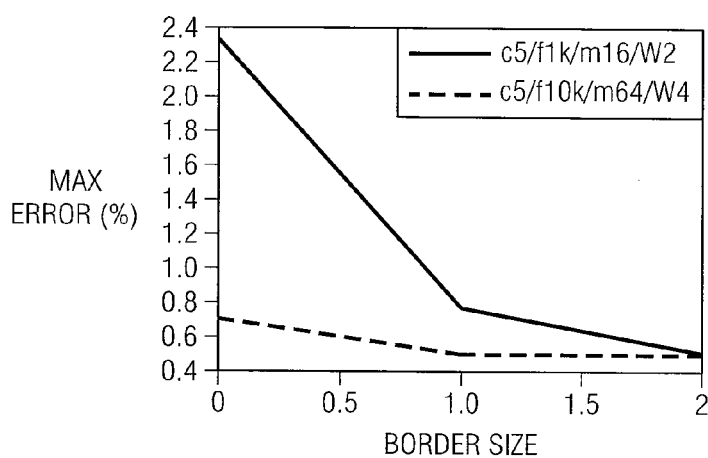
FIG. 6 is a simplified diagram illustrating a maximum error in MPS as a function of border size in accordance with an embodiment of the present invention.

FIG. 6 is a simplified diagram illustrating a maximum error in MPS as a function of border size in accordance with an embodiment of the present invention. To give an idea about maximum and average error in ps, we also report the maximum golden FF latencies in the table. One inference to be drawn is that for most of the experiments, the maximum latency error by MPS is less than 4 ps. In one or two cases, it is 9 ps.

One conclusion to be drawn from the high accuracy of MPS is that the window border W'-W seems to be enough to model almost all the nodes outside W that can influence the core W of the window W'. Impact of the nodes that are outside W' on the delay of FFs in W is very small.

We also performed an experiment to determine how the length of the border affects the MPS accuracy. For coarse meshes (16×16 mesh on a 5 mm×5 mm chip), the maximum error reduces as the border is increased. However, for finer meshes (e.g., 64×64 mesh on a 5 mm×5 mm chip), the maximum error remains same as the border is increased beyond 1 grid unit. This is shown in FIG. 6.

In addition, as with SWS, the MPS accuracy is not a function of window size. Then, we can decide an optimum window size for another objective such as memory or CPU.

TABLE 2

Speed-up of MPS over SWS for serial and parallel runs

| experiment | |W| | serial | parallel |
| --- | --- | --- | --- |
| c5/f1K/m16 | 2 | 33.00 | 20.79 |
|  | 4 | 10.87 | 8.30 |
|  | 8 | 3.48 | 3.02 |
|  | 12 | 2.60 | 1.24 |
| c5/f10K/m16 | 2 | 8.19 | 5.09 |
|  | 4 | 2.89 | 2.39 |
|  | 8 | 1.49 | 1.43 |
|  | 12 | 1.38 | 1.14 |
| c5/f10K/m64 | 4 | 307.00 | 278.28 |
|  | 8 | 95.50 | 78.29 |
|  | 16 | 14.50 | 13.47 |
|  | 32 | 3.33 | 3.20 |
|  | 48 | 2.75 | 1.44 |
| c5x10/f16.7K/m64 | 4 | 217.00 | 26.00 |

Table 2 presents CPU time comparison of MPS with SWS for the experiments shown in Table 1. The results are presented for both serial and parallel executions of MPS and SWS. In serial execution, different simulations (corresponding to different window locations) for a design instance (chip+mesh) are run sequentially on a single processor and the total CPU time for all simulations is determined. In parallel execution, each simulation is run on a different processor and the maximum CPU time over all simulations is recorded.

It can be seen that MPS can be up to 307 times faster for serial simulation and up to 278 times faster for parallel simulation. For smaller window sizes, the MPS speed-up ratio over SWS is much higher. The reason is that the region outside a small window is much larger than the model. Since MPS completely abstracts out the outside region, it generates a much smaller model than SWS, and consequently yields very significant speed-ups. For larger window sizes, speed-up of 3 to 10 times is observed.

As mentioned earlier, MPS consumes less memory than SWS. For this reason, MPS could complete on an actual switch chip design, with 7.6 million instances, 287.4K FFs and two mesh sizes: 64×64 and 128×128, whereas SWS ran out of memory for both mesh sizes. In this experiment, SWS and MPS were run on a 2.4 GHz Linux machine with 1 GB main memory.

Previously, it was noted that small window sizes are optimum for parallel execution of SWS, since the simulation model for a smaller window is smaller and hence it executes faster. On the other hand, larger windows were seen to yield smaller total simulation time. Therefore, they are preferable for sequential simulation, as long as the SWS model fits in the machine memory.

Figure 7:
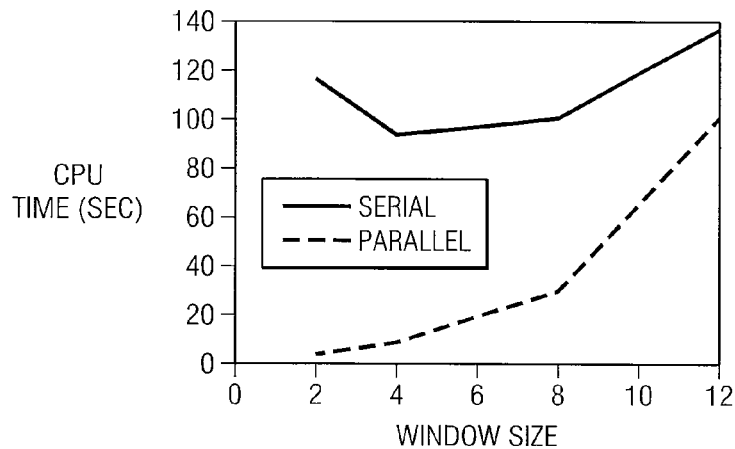
FIG. 7 is a simplified diagram charting CPU time for MPS on c5/f1K/m16 as a function of window size in accordance with an embodiment of the present invention.
Figure 8:
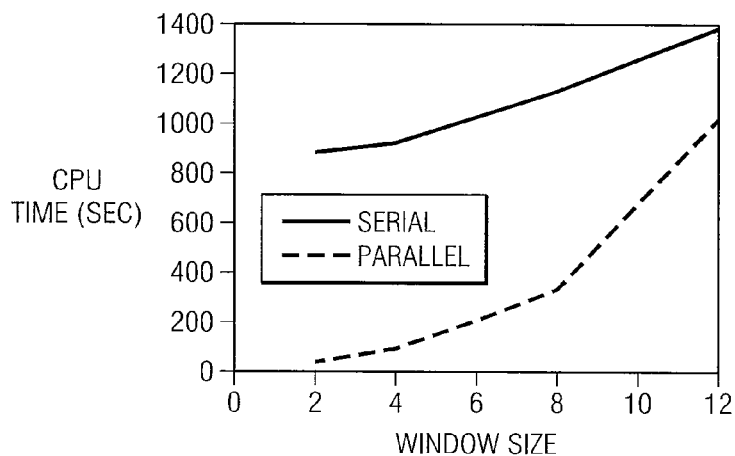
FIG. 8 is a simplified diagram charting CPU time for MPS on c5/f10K/m16 as a function of window size in accordance with an embodiment of the present invention.
Figure 9:
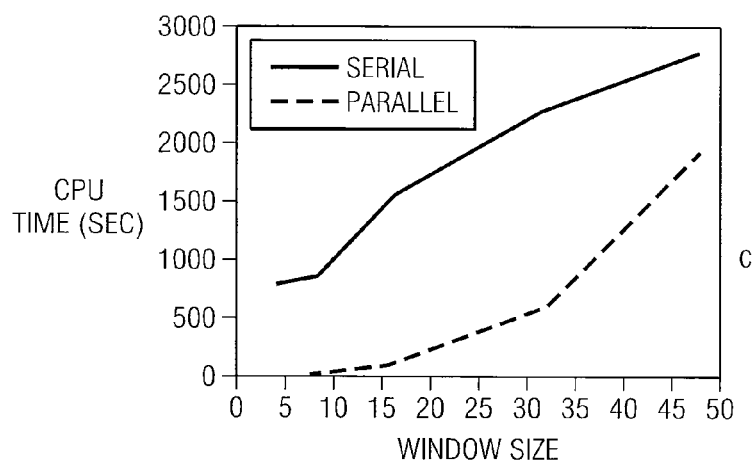
FIG. 9 is a simplified diagram charting CPU time for MPS on c5/f10K/m64 as a function of window size in accordance with an embodiment of the present invention.

The CPU time of MPS as a function of the window size is plotted. For circuits c5/f1K/m16, c5f/10K/m16, and c5/f10K/m64, the plots are shown in FIGS. 7, 8, 9 respectively. Interestingly, for all circuits, CPU times for both serial and parallel execution increase with window size. Since a smaller window has a smaller model size and hence better chance of fitting in the machine memory, for MPS the optimum strategy is to pick the smallest possible window size.

FIG. 7 is a simplified diagram charting CPU time for MPS on c5/f1K/m16 as a function of window size in accordance with an embodiment of the present invention. FIG. 8 is a simplified diagram charting CPU time for MPS on c5/f10K/m16 as a function of window size in accordance with an embodiment of the present invention. FIG. 9 is a simplified diagram charting CPU time for MPS on c5/f10K/m64 as a function of window size in accordance with an embodiment of the present invention.

In terms of the application of MPS and the clock mesh uncertainty analysis, assume that the clock cycle is τ. In practice, at a given flip-flop on a chip, two consecutive clock rising (or falling) edges may not be τ time units apart. Moreover, for the same corresponding flip-flop on two chips, the clock latencies from the clock source may be different. Clock timing uncertainty denotes the deviation of the timing of the clock edge from its expected value. Uncertainty affects $a_s$ and $a_e$ in (1) and hence $d_{max}$ or τ, as discussed above. Uncertainty in clock timing can be due to supply noise, temperature variation, within die and die-to-die process variations (e.g., channel length, oxide thickness, dopant density, interconnect width and thickness), crosstalk noise and PLL jitter.

TABLE 3

3σ variations for different parameters

| parameters | 3σ variations |
| --- | --- |
| NMOS/PMOS channel length | 0.008μ |
| NMOS/PMOS threshold voltage | 20 mV |
| interconnect resistance | 20.00% |
| interconnect capacitance | 5.00% |
| temperature | 20 C. |
| $V_{dd}$ | 10.00% |
| crosstalk switching probability | 0.5 |

With technology scaling, the magnitude of parameter variations and the sensitivity of clock latency towards variations are increasing. Given a mesh-based clock architecture, it becomes important to analyze its timing uncertainty in the presence of parameter variations. If the clock network is a tree, uncertainty analysis can be carried out using gate-level statistical static timing analysis. However, such an approach is not directly applicable for a mesh-based clock network due to metal loops (cycles) present in the mesh. In one proposal, SWS was used to solve this problem as follows. Variation parameters were attached with each buffer and wire on the clock network. For each window W' of SWS, a SPICE model of the mesh was created and Monte Carlo simulations (MCSs) were carried out. In each run of the MCSs, the values of variation parameters for each component of the clock network were determined from their respective distributions, and the latency $D_i$ of each flip-flop $FF_i$ that lies in the core of W' (i.e., in W'-W) was computed. After all runs are completed, a distribution of the delay $D_i$ is available for each such $FF_i$. The uncertainty $U(D_i)=3\sigma(D_i)$ was then computed from this distribution. Finally, $U(D_i)$s were collected from all windows W' to yield uncertainties at all the FFs in the design.

By simply replacing SWS with MPS in the above methodology, mesh uncertainty analysis can be sped up. Variations on $V_{dd}$ values of clock buffers, buffer and wire temperatures, transistor channel length and threshold voltage, and interconnect resistance and capacitance were used. The variation values are shown in Table 3. Table 4 shows speed-up results for mesh uncertainty analysis, running SWS and MPS-based 400 Monte Carlo simulations on c5/f1K/m16 with window sizes of 4×4 and 8×8. MPS obtains 2.5 and 2.0 times speed-up over SWS. Significantly, the total SWS run-time for serial run was 300 hours for the first row, but with MPS, it was 118 hours. Therefore, a speed-up of 2.5 is a big win. Using MPS, the mean clock latency was 647 ps and the maximum FF uncertainty was 33 ps. These values are almost identical to those obtained with the SWS-based uncertainty analysis.

TABLE 4

Speed-up of MPS over SWS for uncertainty analysis

| experiment | |W| | speed-up |
|---|---|---|
| c5/f1K/m16 | 4 | 2.53 |
| c5/f1K/m16 | 8 | 2.04 |

During uncertainty analysis, the latency analysis is carried out multiple times, each time with different parameter values. Hence, the expected speed-up of MPS over SWS should be similar to that obtained in latency analysis (Table 2). The observed speed-ups in Table 4, however, are smaller. For instance, for c5/f1K/m16 window size 4, the latency speed-up is 10.87, and for c5/f1K/m16 window size 8, the latency speed-up is 3.48 (from Table 2). This behavior is due to additional steps in uncertainty analysis that need to be executed for both SWS and MPS, such as setting parameter variations using Gaussian distribution & computing parameter values during each MC run as per the distribution, and introduction of crosstalk noise sources. Given the large run-times for uncertainty analysis, smaller mesh and design instances were examined. On these examples, the contribution of the additional factors on the run-time can be significant. However, on larger test cases, the MPS/SWS speed-up for uncertainty analysis is expected to approach that for latency analysis.

MPS can be applied to any mesh-based clock architecture. So far, we discussed its application to a pure mesh architecture (FIG. 1). However, it can also be applied easily to mesh-based hybrid architectures, such as mesh with local trees (FIG. 10) and multiple local meshes (FIG. 11).

FIG. 10 is a simplified diagram illustrating a mesh along with local trees in accordance with an embodiment of the present invention. FIG. 11 is a simplified diagram of a clock architecture with multiple meshes in accordance with an embodiment of the present invention.

In regards to a non-uniform mesh, in the above discussion, the assumption is a uniform mesh, for which all mesh segments in X (Y) direction have identical lengths and widths. Simulations have shown that to obtain smaller skew, regions where FF density is higher should have a finer mesh. In sparsely FF-populated regions, having a coarse mesh (in the extreme case, no mesh) does not affect the skew and can save significant area and power. Moreover, there may be certain regions of the chip, where a mesh segment cannot be routed due to routing blockages such as RAMs and third-party IPs. Thus, non-uniform clock meshes are not only highly desirable (to save area and power), but also inevitable in some cases.

Several non-uniform meshes were also designed, including meshes with holes (FIG. 12). FIG. 12 is a simplified diagram of an example non-uniform mesh in accordance with an embodiment of the present invention. We applied MPS and compared with the golden simulations. The accuracy with respect to the golden flat simulation was found to be similar to the numbers shown in Table 1.

In regards to an optimum clock mesh design, MPS can be used at clock mesh planning stage to determine the optimum mesh that meets timing (latency, maximum skew), power and area constraints. This is before the mesh is actually routed. Examples of mesh parameters are mesh size (granularity), uniform vs. non-uniform mesh, wire widths, and mesh buffer sizes. At the planning stage, wire segments can be modeled with the simplest model, such as single $\pi$. The designer can first design the mesh by selecting mesh parameters, running MPS, and checking the timing, area and power. If the timing numbers do not meet the desired skew margin, a finer mesh can be quickly synthesized and simulated. These iterations can be carried out till design goals are met. Previously, comparisons were made between latency, maximum skew, and power consumption for different mesh sizes for an actual chip.

In regards to designing a clock network after power-mesh design and cell placement, clock network is usually designed after power/ground meshes have been designed and cells & macros have been placed. Then, the routing blockages are known and the clock mesh routing must avoid these (on appropriate metal layers). This may introduce holes. After the clock mesh has been finally routed, MPS can be used to do the final clock mesh analysis.

Analyzing clock mesh of a large industrial design has been a difficult problem. Discussed herein is an improved sliding window scheme, called MPS, to analyze the latency in clock meshes. MPS inherits all the advantages of SWS, such as being able to model large meshes with accuracy. It is superior to SWS in that it consumes much less memory and is up to 300 times faster than the original SWS scheme. We showed that it can complete on real design and mesh instances, where SWS could not. We also presented several design and analysis scenarios in which MPS can be applied. For instance, clock mesh uncertainty analysis (where MPS could cut down the Monte Carlo-based simulation time from 300 hours taken by SWS to 120 hours), mesh-based hybrid architectures, non-uniform meshes, optimum clock mesh design, and post-power-mesh and -cell-placement.

Some of the steps illustrated or discussed previously may be changed or deleted where appropriate and additional steps may also be added to the flowcharts. These changes may be based on specific digital architectures or particular interfacing arrangements and configurations of associated elements and do not depart from the scope or the teachings of the present invention. The interactions and operations of the elements within the proposed clock mesh solution, as disclosed in the FIGURES and the tables, have provided merely one example for their potential applications. Numerous other applications may be equally beneficial and selected based on particular digital system or microprocessor needs.

Although the present invention has been described in detail with reference to particular embodiments, the outlined solution may be extended to any scenario in which there is a need for such a clock mesh tool. Numerous other changes, substitutions, variations, alterations, and modifications may be ascertained to one skilled in the art and it is intended that the present invention encompass all such changes, substitutions, variations, alterations, and modifications as falling within the scope of the appended claims.

What is claimed is:

1. A method for clock mesh analysis, comprising:
accessing by one or more computer systems:
a description of a chip comprising a plurality of sequential elements and a clock mesh, the description identifying the sequential elements, indicating locations of the sequential elements on the chip, specifying interconnections among the sequential elements on the chip, and specifying a layout of the chip;
information for modeling the sequential elements and interconnections; and
a set of parameters of the clock mesh;
using the description of the chip, the information for modeling the sequential elements and interconnections, and the set of parameters of the clock mesh:
determining by the one or more computer systems a plurality of original window locations covering the clock mesh, each original window location comprising one or more of the sequential elements on the chip; and
for each original window location:
expanding the original window location in one or more directions to generate a larger window location;
generating by the one or more computer systems a mesh simulation model inside the larger window location and outside the window location, wherein for each of one or more mesh nodes outside the window location, all components within a unit region covered by the mesh node are approximated at the mesh node using at least a sum of clock-input pin capacitances of all the components within the unit region to obtain a single capacitance at said each mesh node;
simulating by the one or more computer systems the mesh simulation model; and
measuring by the one or more computer systems clock timing for the sequential elements in the original window location based on the simulation of the mesh simulation model; and
collecting by the one or more computer systems timing information on all the sequential elements on the chip based on the measured clock timing for the sequential elements in the original window locations.

2. The method of claim 1, wherein two or more of the original window locations are processed in parallel with each other.

3. The method of claim 1, wherein an architecture of the clock mesh comprises a single mesh or a plurality of meshes.

4. The method of claim 1, wherein an architecture of the clock mesh comprises a global tree.

5. The method of claim 1, wherein an architecture of the clock mesh comprises a local distribution that comprises either a direct connection to each sequential element on the chip or a plurality of local trees.

6. The method of claim 1, wherein the mesh simulation model inside the larger window location comprises an explicit representation of a connection to each sequential element in the larger window location, the explicit representation comprising an accurate interconnection model.

7. Logic encoded in one or more tangible media for execution and when executed operable to:
access:
a description of a chip comprising a plurality of sequential elements and a clock mesh, the description identifying the sequential elements, indicating locations of the sequential elements on the chip, specifying interconnections among the sequential elements on the chip, and specifying a layout of the chip;
information for modeling the sequential elements and interconnections; and
a set of parameters of the clock mesh;
use the description of the chip, the information for modeling the sequential elements and interconnections, and the set of parameters of the clock mesh:
determine a plurality of original window locations covering the clock mesh, each original window location comprising one or more of the sequential elements on the chip; and
for each original window location:
expand the original window location in one or more directions to generate a larger window location;
generate a mesh simulation model inside the larger window location and outside the window location, wherein for each of one or more mesh nodes outside the window location, all components within a unit region covered by the mesh node are approximated at the mesh node using at least a sum of clock-input pin capacitances of all the components within the unit region to obtain a single capacitance at said each mesh node;
simulate the mesh simulation model; and
measure clock timing for the sequential elements in the original window location based on the simulation of the mesh simulation model; and
collect timing information on all the sequential elements on the chip based on the measured clock timing for the sequential elements in the original window locations.

8. The logic of claim 7, wherein two or more of the original window locations are processed in parallel with each other.

9. The logic of claim 7, wherein an architecture of the clock mesh comprises a single mesh or a plurality of meshes.

10. The logic of claim 7, wherein an architecture of the clock mesh comprises a global tree.

11. The logic of claim 7, wherein an architecture of the clock mesh comprises a local distribution that comprises either a direct connection to each sequential element on the chip or a plurality of local trees.

12. The logic of claim 7, wherein the mesh simulation model inside the larger window location comprises an explicit representation of a connection to each sequential element in the larger window location, the explicit representation comprising an accurate interconnection model.

13. An apparatus, comprising:
one or more processors; and
a memory coupled to the processors comprising one or more instructions, the processors operable when executing the instructions to:
access:
a description of a chip comprising a plurality of sequential elements and a clock mesh, the description identifying the sequential elements, indicating locations of the sequential elements on the chip, specifying interconnections among the sequential elements on the chip, and specifying a layout of the chip;
information for modeling the sequential elements and interconnections; and
a set of parameters of the clock mesh;
use the description of the chip, the information for modeling the sequential elements and interconnections, and the set of parameters of the clock mesh:
determine a plurality of original window locations covering the clock mesh, each original window location comprising one or more of the sequential elements on the chip; and for each original window location:
: expand the original window location in one or more directions to generate a larger window location;
generate a mesh simulation model inside the larger window location and outside the window location, wherein for each of one or more mesh nodes outside the window location, all components within a unit region covered by the mesh node are approximated at the mesh node using at least a sum of clock-input pin capacitances of all the components within the unit region to obtain a single capacitance at said each mesh node;
simulate the mesh simulation model; and
measure clock timing for the sequential elements in the original window location based on the simulation of the mesh simulation model; and
collect timing information on all the sequential elements on the chip based on the measured clock timing for the sequential elements in the original window locations.

14. The apparatus of claim 13, wherein two or more of the original window locations are processed in parallel with each other.

15. The apparatus of claim 13, wherein an architecture of the clock mesh comprises a single mesh or a plurality of meshes.

16. The apparatus of claim 13, wherein an architecture of the clock mesh comprises a global tree.

17. The apparatus of claim 13, wherein an architecture of the clock mesh comprises a local distribution that comprises either a direct connection to each sequential element on the chip or a plurality of local trees.

18. The apparatus of claim 13, wherein the mesh simulation model inside the larger window location comprises an explicit representation of a connection to each sequential element in the larger window location, the explicit representation comprising an accurate interconnection model.

19. A system comprising:
means for accessing:
: a description of a chip comprising a plurality of sequential elements and a clock mesh, the description identifying the sequential elements, indicating locations of the sequential elements on the chip, specifying interconnections among the sequential elements on the chip, and specifying a layout of the chip;
information for modeling the sequential elements and interconnections; and
a set of parameters of the clock mesh;

means for manipulating the description of the chip, the information for modeling the sequential elements and interconnections, and the set of parameters of the clock mesh:
means for determining a plurality of original window locations covering the clock mesh, each original window location comprising one or more of the sequential elements on the chip; and
for each original window location:
: means for expanding the original window location in one or more directions to generate a larger window location;
means for generating a mesh simulation model inside the larger window location and outside the window location, wherein for each of one or more mesh nodes outside the window location, all components within a unit region covered by the mesh node are approximated at the mesh node using at least a sum of clock-input pin capacitances of all the components within the unit region to obtain a single capacitance at said each mesh node;
means for simulating the mesh simulation model; and
means for measuring clock timing for the sequential elements in the original window location based on the simulation of the mesh simulation model; and
means for collecting timing information on all the sequential elements on the chip based on the measured clock timing for the sequential elements in the original window locations.

20. The system of claim 19, wherein two or more of the original window locations are processed in parallel with each other.

* * * * *